United States Patent
Zhang et al.

(10) Patent No.: US 10,014,343 B2
(45) Date of Patent: Jul. 3, 2018

(54) PIXEL STRUCTURE, DISPLAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Zhengxin Zhang, Beijing (CN); Shuai Xu, Beijing (CN); Jingshan Ma, Beijing (CN); Zhiyong Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/511,453

(22) PCT Filed: Mar. 15, 2016

(86) PCT No.: PCT/CN2016/076359
§ 371 (c)(1),
(2) Date: Mar. 15, 2017

(87) PCT Pub. No.: WO2016/169356
PCT Pub. Date: Oct. 27, 2016

(65) Prior Publication Data
US 2017/0294481 A1 Oct. 12, 2017

(30) Foreign Application Priority Data
Apr. 24, 2015 (CN) .......................... 2015 1 0203146

(51) Int. Cl.
*H01L 27/15* (2006.01)
*G09F 9/302* (2006.01)

(52) U.S. Cl.
CPC ............ *H01L 27/156* (2013.01); *G09F 9/302* (2013.01)

(58) Field of Classification Search
None
See application file for complete search history.

(56) References Cited

U.S. PATENT DOCUMENTS

| 2006/0170712 A1 | 8/2006 | Miller et al. |
| 2014/0098418 A1 | 4/2014 | Lin |

(Continued)

FOREIGN PATENT DOCUMENTS

| CN | 101881849 A | 11/2010 |
| CN | 102346311 A | 2/2012 |

(Continued)

OTHER PUBLICATIONS

Office Action from corresponding Chinese Application No. 201510203146.0, dated Dec. 26, 2016 (9 pages).

*Primary Examiner* — Michelle Mandala
(74) *Attorney, Agent, or Firm* — Harness, Dickey & Pierce, P.L.C.

(57) ABSTRACT

A pixel structure, a display substrate and a display device are disclosed. The pixel structure comprises a plurality of first pixels, second pixels and third pixels. The first pixel comprises a first sub-pixel arranged at upper-right part and a second sub-pixel arranged at lower-left part. The second pixel comprises the second sub-pixel arranged at upper-right part and a third sub-pixel arranged at lower-left part. The third pixel comprises the third sub-pixel arranged at upper-right part and the first sub-pixel arranged at lower-left part. The second pixels are arranged at the right and upper sides of the first pixels. The third pixels are arranged at the right (Continued)

and upper sides of the second pixels. The first pixels are arranged at the right and upper sides of the third pixels. According to an embodiment, when an image having an oblique boundary, a transverse boundary and/or a vertical boundary is displayed, the phenomenon of color crispening will not occur because the first sub-pixels, the second sub-pixels and the third sub-pixels are arranged along the boundary of the image in a staggered way.

20 Claims, 5 Drawing Sheets

(56) References Cited

U.S. PATENT DOCUMENTS

2015/0009104 A1     1/2015   Kim et al.
2016/0005382 A1*   1/2016   Guo ..................... G09G 3/2003
                                                                                         345/694

FOREIGN PATENT DOCUMENTS

| CN | 202171712 U | 3/2012 |
|----|-------------|--------|
| CN | 202887618 U | 4/2013 |
| CN | 103366683 A | 10/2013 |
| CN | 104282727 A | 1/2015 |
| CN | 104460090 A | 3/2015 |
| CN | 104464539 A | 3/2015 |
| CN | 104809956 A | 7/2015 |

* cited by examiner

PIXEL STRUCTURE, DISPLAY SUBSTRATE AND DISPLAY DEVICE

CROSS-REFERENCE TO RELATED APPLICATION

The present application claims the benefit and priority of Chinese Patent Application No. 201510203146.0 filed on Apr. 24, 2015, the entire content of which is incorporated herein by reference as a part of the present application.

TECHNICAL FIELD

Exemplary embodiments of the present disclosure relate to a pixel structure, a display substrate and a display device.

BACKGROUND

With the development of display technologies, people's pursuit of visual effects is getting higher and higher. Therefore, display products with high pixels per inch (PPI) become the focus of attention of display manufacturers.

In the traditional display substrate, pixel structure adopts an arrangement manner in which RGB (red, green and blue) sub-pixels are circularly arranged. Each pixel has an equal area and consists of a red sub-pixel, a green sub-pixel and a blue sub-pixel transversely arranged, in which each sub-pixel has an equal area, specifically as shown in FIG. 1. The display substrate using such a pixel structure has the same visual resolution as the physical resolution for displaying an image.

When a sub-pixel rendering method is used to drive the sub-pixels, the visual resolution can be made higher than the physical resolution. When a triangle is displayed, the lighted pixels are arranged as shown in FIG. 2. The sum of the number of the blue sub-pixels and the red sub-pixels is equal to the number of the green sub-pixels. The majority of the sub-pixels separating the lighted pixels and unlighted pixels from upper-right to lower-left is red sub-pixel. When a vertical line is displayed, its boundary may consist of red sub-pixels and blue sub-pixels alternately arranged in a vertical direction, or may only consist of green sub-pixels arranged in the vertical direction. This phenomenon will cause color crispening of visual display, and thus affect the display effect.

SUMMARY

The present disclosure provides a pixel structure, a corresponding display substrate and a display device to improve a visual resolution while reducing the appearance of color crispening phenomenon for displaying an image.

According to a first aspect of the present disclosure, there is provided a pixel structure, which includes a plurality of first pixels, second pixels and third pixels. The first pixel includes a first sub-pixel arranged at upper-right part and a second sub-pixel arranged at lower-left part. The second pixel includes the second sub-pixel arranged at upper-right part and a third sub-pixel arranged at lower-left part. The third pixel includes the third sub-pixel arranged at upper-right part and the first sub-pixel arranged at lower-left part. The second pixels are arranged at the right and upper sides of the first pixels, the third pixels are arranged at the right and upper sides of the second pixels, and the first pixels are arranged at the right and upper sides of the third pixels.

According to an embodiment of the present disclosure, the first sub-pixel, the second sub-pixel and the third sub-pixel are in the shape of a right triangle. In the first pixel, a hypotenuse of the first sub-pixel corresponds to that of the second sub-pixel. In the second pixel, the hypotenuse of the second sub-pixel corresponds to that of the third sub-pixel. In the third pixel, the hypotenuse of the third sub-pixel corresponds to that of the first sub-pixel.

According to an embodiment of the present disclosure, the right triangle is an isosceles right triangle.

According to an embodiment of the present disclosure, the first sub-pixel, the second sub-pixel and the third sub-pixel are different, and correspond to red sub-pixel, green sub-pixel and blue sub-pixel respectively.

According to an embodiment of the present disclosure, an adjacent pixel of an object pixel is a sub-pixel that shares a right-angle side with a sub-pixel in the object pixel.

According to an embodiment of the present disclosure, the green sub-pixels occupy more than half of a total area of the first pixels, the second pixels and the third pixels.

According to a second aspect of the present disclosure, there is provided a pixel structure, which includes a plurality of first pixels, second pixels and third pixels. The first pixel includes a first sub-pixel arranged at upper-left part and a second sub-pixel arranged at lower-right part. The second pixel includes a third sub-pixel arranged at upper-left part and the first sub-pixel arranged at lower-right part. The third pixel includes the second sub-pixel arranged at upper-left part and the third sub-pixel arranged at lower-right part. The second pixels are arranged at the right and lower sides of the first pixels, the third pixels are arranged at the right and lower sides of the second pixels, and the first pixels are arranged at the right and lower sides of the third pixels.

According to an embodiment of the present disclosure, the first sub-pixel, the second sub-pixel and the third sub-pixel are in the shape of a right triangle. In the first pixel, a hypotenuse of the first sub-pixel corresponds to that of the second sub-pixel. In the second pixel, the hypotenuse of the third sub-pixel corresponds to that of the first sub-pixel. In the third pixel, the hypotenuse of the second sub-pixel corresponds to that of the third sub-pixel.

According to an embodiment of the present disclosure, the right triangle is an isosceles right triangle.

According to an embodiment of the present disclosure, the first sub-pixel, the second sub-pixel and the third sub-pixel are different, and correspond to red sub-pixel, green sub-pixel and blue sub-pixel respectively.

According to an embodiment of the present disclosure, an adjacent pixel of an object pixel is a sub-pixel that shares a right-angle side with a sub-pixel in the object pixel.

According to an embodiment of the present disclosure, the green sub-pixels occupy more than half of a total area of the first pixels, the second pixels and the third pixels.

According to a third aspect of the present disclosure, there is further provided a display substrate, which includes the pixel structure according to any one of the above embodiments.

According to a fourth aspect of the present disclosure, there is further provided a display device, which includes the aforementioned array substrate.

According to the embodiments of the present disclosure, since each pixel includes two sub-pixels, when a sub-pixel rendering method is used to drive the sub-pixels, the sub-pixel in an adjacent pixel may be used to improve pixels per inch (PPI) of sub-pixels. Furthermore, when displaying an image having an oblique boundary, a transverse boundary and/or a vertical boundary, the phenomenon of color crispening will not occur because the boundary of the image is staggered with the three of the first sub-pixels, the second sub-pixels and the third sub-pixels.

BRIEF DESCRIPTION OF DRAWINGS

In order to describe the technical solutions of embodiments of the present disclosure or that of the prior art more clearly, the accompanying drawings required for describing the embodiments of the present disclosure or the prior art will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Technical solutions in embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those of ordinary skills in the art based on the embodiments of the present disclosure without creative efforts shall fall within the protection scope of the present disclosure.

It should be noted that in the description of the present disclosure, terms "left", "right", "upper", "lower" and the like which indicate orientations or positional relationships are based on the orientation or positional relationships shown by the accompanying drawings, and they are merely used for describing the present disclosure and simplifying the description, rather than indicating or implying that the denoted devices or elements must have the specific orientation, or be constructed and operated by specific orientations, and thus they cannot be understood as limitation of the present disclosure.

In addition, in the present disclosure, terms "first", "second" and "third" are merely for description purpose, rather than being understood as indicating or implying relative importance. The term "a plurality of" refers to two or more than two, unless otherwise clearly defined.

First Embodiment

Figure 1:
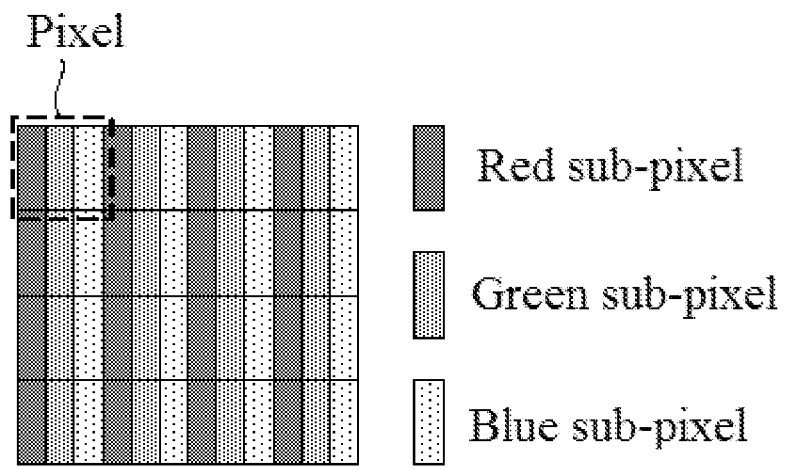
FIG. 1 illustrates a schematic diagram of a pixel structure known in the art.
Figure 2:
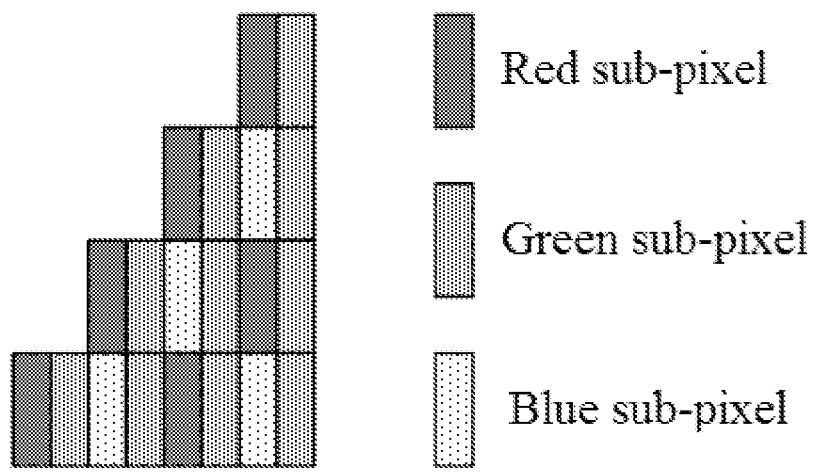
FIG. 2 illustrates a schematic diagram of another pixel structure known in the art.
Figure 3:
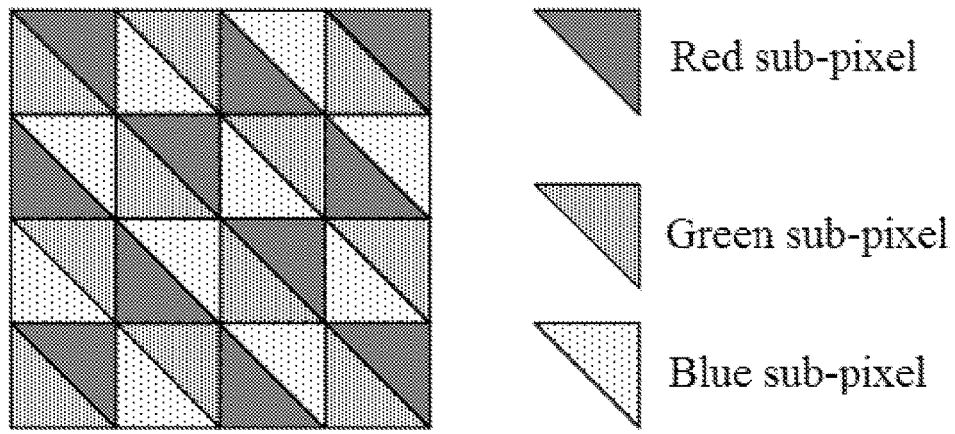
FIG. 3 illustrates a schematic diagram of a pixel structure according to an embodiment of the present disclosure.
Figure 4:
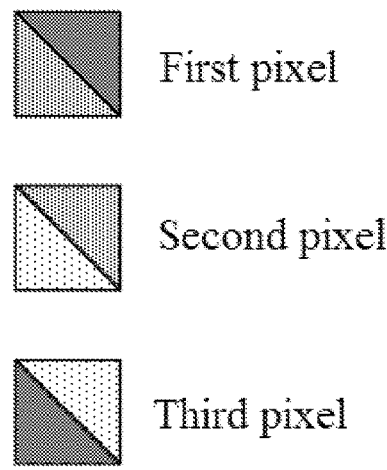
FIG. 4 illustrates a schematic structural diagram of a first pixel, a second pixel and a third pixel according to an embodiment of the present disclosure.

As shown in FIG. 3 and FIG. 4, the pixel structure according to an embodiment of the present disclosure includes a plurality of first pixels, second pixels and third pixels.

The first pixel includes a first sub-pixel (i.e. a red sub-pixel) arranged at upper-right part and a second sub-pixel (i.e. a green sub-pixel) arranged at lower-left part.

The second pixel includes the second sub-pixel (i.e. the green sub-pixel) arranged at upper-right part and a third sub-pixel (i.e. a blue sub-pixel) arranged at lower-left part.

The third pixel includes the third sub-pixel (i.e. the blue sub-pixel) arranged at upper-right part and the first sub-pixel (i.e. the red sub-pixel) arranged at lower-left part.

The second pixels are arranged at the right and upper sides of the first pixels, the third pixels are arranged at the right and upper sides of the second pixels, and the first pixels are arranged at the right and upper sides of the third pixels.

Figure 5:
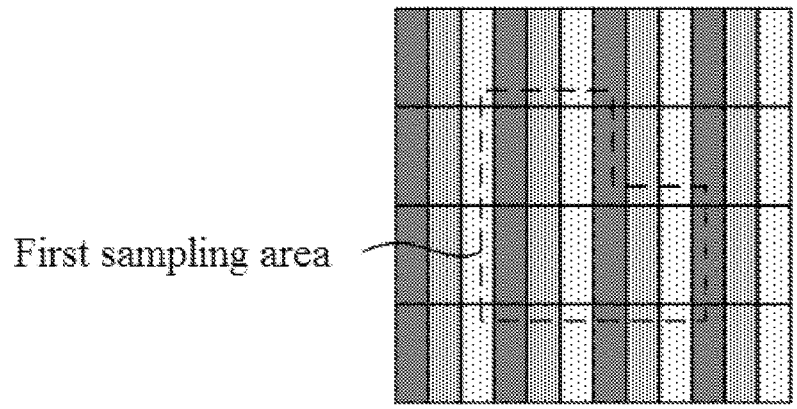
FIG. 5 illustrates a schematic diagram of a sampling area with a pixel structure known in the art.
Figure 6:
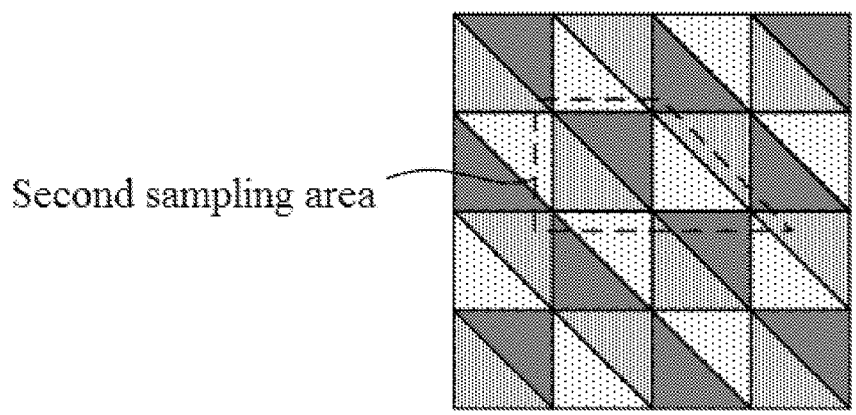
FIG. 6 illustrates a schematic diagram of a sampling area with a pixel structure according to an embodiment of the present disclosure.

In such a pixel structure, since each pixel includes two sub-pixels, the number of each type of sub-pixels are equal, when the sub-pixel rendering method is used to drive the sub-pixels, a sub-pixel in an adjacent pixel may be borrowed. As shown in FIG. 5, a first sampling area arranged in the pixel structure in the prior art corresponds to a second sampling area arranged in the pixel structure of the first embodiment as shown in FIG. 6. In the pixel structure as shown in FIG. 5, each pixel includes three sub-pixels, 3×4×4=48 sub-pixels will be lighted when an image having 4×4 pixels is displayed. In the pixel structure as shown in FIG. 6, 2×4×4=32 sub-pixels will be lighted when an image having 4×4 pixels is displayed. That is, a resolution of the pixel structure in FIG. 6 is 1.5 (48/32) times of that of the pixel structure in FIG. 5, and ⅓ of sub-pixels may not be used when the same number of pixel arrays are displayed, thereby improving pixels per inch (PPI) of the sub-pixels.

Figure 7:
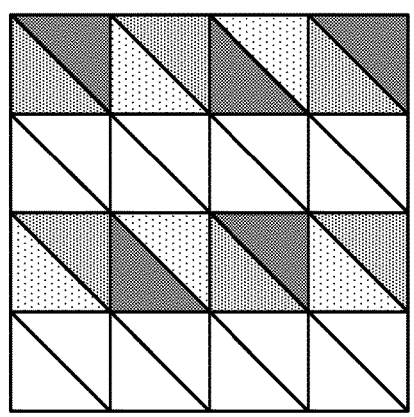
FIG. 7 illustrates a schematic structural diagram of lighted pixels when a transverse line is displayed by a pixel structure according to an embodiment of the present disclosure.
Figure 8:
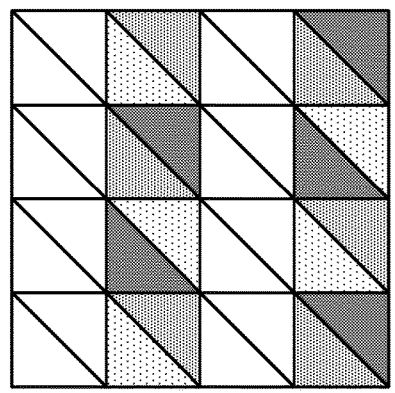
FIG. 8 illustrates a schematic structural diagram of lighted pixels when a vertical line is displayed by a pixel structure according to an embodiment of the present disclosure.
Figure 9:
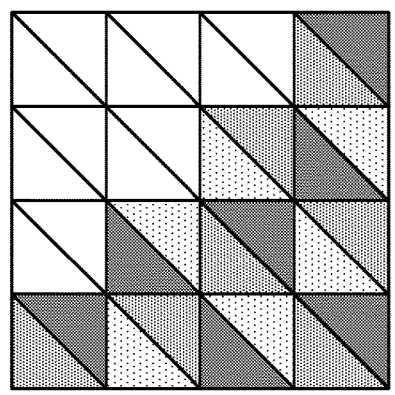
FIG. 9 illustrates a schematic structural diagram of lighted pixels when an image having a 45° boundary is displayed by a pixel structure according to an embodiment of the present disclosure.

Specifically, when transverse lines are displayed by a pixel structure according to this embodiment, lighted pixels are as shown in FIG. 7, that is, the first sub-pixels, the second sub-pixels and the third sub-pixels in each transverse line are arranged in a staggered way. When vertical lines are displayed by a pixel structure according to this embodiment, lighted pixels are as shown in FIG. 8, that is, the first sub-pixels, the second sub-pixels and the third sub-pixels in each vertical line are arranged in a staggered way. When an image having a 45° boundary is displayed by a pixel structure according to this embodiment, lighted pixels are as shown in FIG. 9, that is, the first sub-pixels, the second sub-pixels and the third sub-pixels in the boundary line are arranged in a staggered way.

Thus, when an image having an oblique boundary, a transverse boundary and/or a vertical boundary is displayed by the pixel structure arranged according to the embodiments of the present disclosure, a phenomenon of color crispening will not occur because the first sub-pixels, the second sub-pixels and the third sub-pixels are arranged along the boundary of the image in a staggered way, thereby improving a viewing effect for users.

According to an embodiment of the present disclosure, the first sub-pixel, the second sub-pixel and the third sub-pixel are in the shape of a right triangle.

In the first pixel, a hypotenuse of the first sub-pixel corresponds to that of the second sub-pixel (that is, the hypotenuse of the red sub-pixel overlaps with that of the green sub-pixel).

In the second pixel, the hypotenuse of the second sub-pixel corresponds to that of the third sub-pixel (that is, the hypotenuse of the green sub-pixel overlaps with that of the blue sub-pixel).

In the third pixel, the hypotenuse of the third sub-pixel corresponds to that of the first sub-pixel (that is, the hypotenuse of the blue sub-pixel overlaps with that of the red sub-pixel).

When an image is displayed by the pixel structure according to this embodiment, since the hypotenuses of two right triangle sub-pixels in each pixel correspond to each other (for example, the two hypotenuses are overlapped with each other), that is, two sub-pixels in each pixel may constitute a rectangle, if a transverse line and/or a vertical line are displayed, the boundaries of the transverse line and/or the vertical line are regular straight lines without serration at the boundary.

According to an embodiment of the present disclosure, the right triangle may be an isosceles right triangle. An area utilization ratio of the isosceles right triangle is higher than that of other kinds of right triangle, so that pixels may be reasonably arranged and the area of the display screen may be utilized fully.

According to an embodiment of the present disclosure, the first sub-pixel is the red sub-pixel, the second sub-pixel is the green sub-pixel, and the third sub-pixel is the blue sub-pixel. This embodiment corresponds to the pixel structure as shown in FIG. 3.

Figure 10:
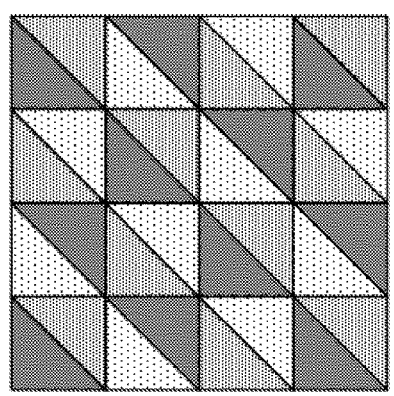
FIG. 10 illustrates a schematic diagram of a pixel structure according to another embodiment of the present disclosure.
Figure 10:
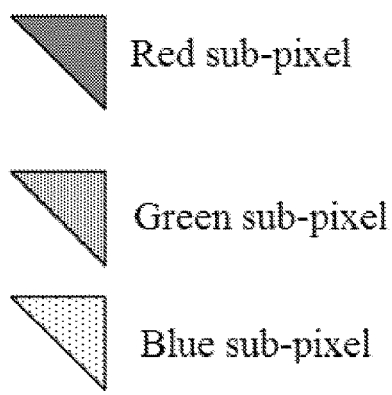

According to another embodiment of the present disclosure, the first sub-pixel is the green sub-pixel, the second sub-pixel is the red sub-pixel, and the third sub-pixel is the blue sub-pixel. This embodiment corresponds to the pixel structure as shown in FIG. 10.

According to still another embodiment of the present disclosure, the green sub-pixels may occupy more than half (greater than or equal to ½) of a total area of the pixels. The high percentage of the green sub-pixels can effectively improve the overall display brightness of the substrate, because the brightness of the green sub-pixel is higher than that of the red sub-pixel and also that of the blue sub-pixel.

According to an embodiment of the present disclosure, when an object pixel is lighted, an adjacent pixel of the lighted object pixel is a sub-pixel that shares a corresponding right-angle side (i.e., the overlapped right-angle side) with a sub-pixel in the object pixel. By using the sub-pixel rendering method to drive the sub-pixels, the lighted pixel may borrow its absent sub-pixel from adjacent pixels, thereby achieving a complete color gamut display.

Second Embodiment

Figure 11:
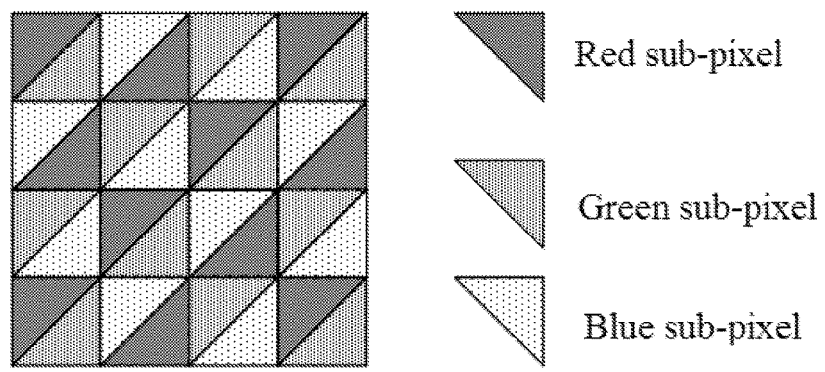
FIG. 11 illustrates a schematic diagram of a pixel structure according to yet another embodiment of the present disclosure.

As shown in FIG. 11, the pixel structure according to yet another embodiment of the present disclosure includes a plurality of first pixels, second pixels and third pixels.

The first pixel includes the first sub-pixel (i.e. the red sub-pixel) arranged at upper-left part and the second sub-pixel (i.e. the green sub-pixel) arranged at lower-right part.

The second pixel includes the third sub-pixel (i.e. the blue sub-pixel) arranged at upper-left part and the first sub-pixel (i.e. the red sub-pixel) arranged at lower-right part.

The third pixel includes the second sub-pixel (i.e. the green sub-pixel) arranged at upper-left part and the third sub-pixel (i.e. the blue sub-pixel) arranged at lower-right part.

The second pixels are arranged at the right and lower sides of the first pixels, the third pixels are arranged at the right and lower sides of the second pixels, and the first pixels are arranged at the right and lower sides of the third pixels.

According to an embodiment of the present disclosure, the first sub-pixel, the second sub-pixel and the third sub-pixel may be in the shape of a right triangle.

In the first pixel, the hypotenuse of the first sub-pixel corresponds to that of the second sub-pixel (that is, the hypotenuse of the red sub-pixel overlaps with that of the green sub-pixel).

In the second pixel, the hypotenuse of the third sub-pixel corresponds to that of the first sub-pixel (that is, the hypotenuse of the blue sub-pixel overlaps with that of the red sub-pixel).

In the third pixel, the hypotenuse of the second sub-pixel corresponds to that of the third sub-pixel (that is, the hypotenuse of the green sub-pixel overlaps with that of the blue sub-pixel).

According to an embodiment of the present disclosure, the right triangle may be an isosceles right triangle.

According to an embodiment of the present disclosure, the first sub-pixel is the red sub-pixel, the second sub-pixel is the green sub-pixel, and the third sub-pixel is the blue sub-pixel. This embodiment corresponds to the pixel structure as shown in FIG. 11.

Figure 12:
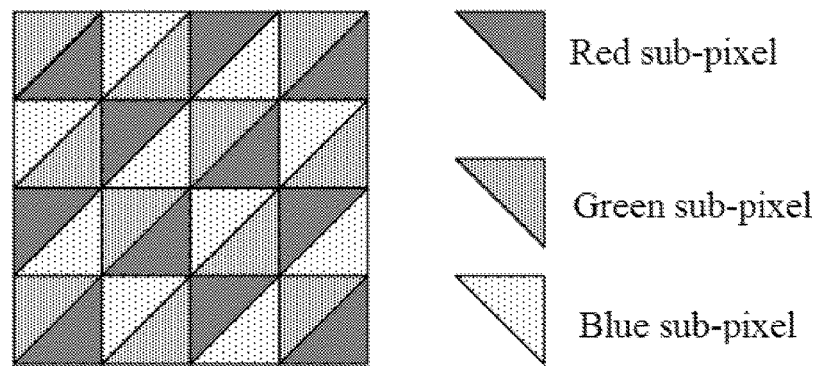
FIG. 12 illustrates a schematic diagram of a pixel structure according to still another embodiment of the present disclosure.

According to another embodiment of the present disclosure, the first sub-pixel is the green sub-pixel, the second sub-pixel is the red sub-pixel, and the third sub-pixel is the blue sub-pixel. This embodiment corresponds to the pixel structure as shown in FIG. 12.

According to an embodiment of the present disclosure, when the object pixel is lighted, the adjacent pixel of the lighted object pixel is a sub-pixel that shares a corresponding right-angle side (i.e., the overlapped right-angle side) with a sub-pixel in the object pixel.

Similar to the first embodiment, when the image having an oblique boundary, a transverse boundary and/or a vertical boundary is displayed by the pixel structure according to the second embodiment, the phenomenon of color crispening will not occur because the first sub-pixels, the second sub-pixels and the third sub-pixels are arranged along the boundary of the image in a staggered way, thereby improving a viewing effect for users.

According to an embodiment of the present disclosure, there is further provided a display substrate, which includes the pixel structure according to the first embodiment and/or the pixel structure according to the second embodiment.

According to an embodiment of the present disclosure, there is further provided a display device, which includes the aforementioned display substrate.

It is to be noted that the display device in this embodiment may be any product or component having a display function, such as an electronic paper, a mobile phone, a tablet computer, a TV set, a notebook computer, a digital photo frame, a navigation device and so on.

The technical solutions of the present disclosure are described in detail with reference to the accompanying drawings. In the prior art, color crispening may easily occur when an image is displayed by using the sub-pixel rendering method to drive the pixel structure. According to an embodiment of the present disclosure, when an image having an oblique boundary, a transverse boundary and/or a vertical boundary is displayed, the phenomenon of color crispening will not occur because the first sub-pixels, the second sub-pixels and the third sub-pixels are arranged along the boundary of the image in a staggered way.

The abovementioned embodiments are merely the embodiments of the present disclosure, but the scope of protection of the present disclosure is not limited thereto. Any variation or substitution easily conceivable to a person of ordinary skills in the art within the technical scope disclosed in the present disclosure shall fall into the protection scope of the present disclosure. Therefore, the protection scope of the present disclosure shall be subject to the protection scope of the claims.

What is claimed is:

1. A pixel structure, comprising:
   a plurality of first pixels, second pixels and third pixels;
   wherein each of the first pixels comprises a first type of sub-pixel arranged at its upper-right part and a second type of sub-pixel arranged at its lower-left part;
   wherein each of the second pixels comprises the second type of sub-pixel arranged at its upper-right part and a third type of sub-pixel arranged at its lower-left part;
   wherein each of the third pixels comprises the third type of sub-pixel arranged at its upper-right part and the first type of sub-pixel arranged at its lower-left part; and
   wherein the second pixels are arranged at the right and upper sides of the first pixels, the third pixels are arranged at the right and upper sides of the second pixels, and the first pixels are arranged at the right and upper sides of the third pixels.

2. The pixel structure according to claim 1, wherein the first type of sub-pixel, the second type of sub-pixel and the third type of sub-pixel are in the shape of a right triangle;
   wherein in said each of the first pixels, a hypotenuse of the first type of sub-pixel corresponds to that of the second type of sub-pixel;
   wherein in said each of the second pixels, a hypotenuse of the second type of sub-pixel corresponds to that of the third type of sub-pixel; and
   wherein in said each of the third pixels, a hypotenuse of the third type of sub-pixel corresponds to that of the first type of sub-pixel.

3. The pixel structure according to claim 2, wherein the right triangle is an isosceles right triangle.

4. The pixel structure according to claim 1, wherein the first type of sub-pixel, the second type of sub-pixel and the third type of sub-pixel are different, and correspond to a red sub-pixel, a green sub-pixel and a blue sub-pixel, respectively.

5. The pixel structure according to claim 2, wherein an adjacent sub-pixel of an object pixel is a sub-pixel that shares a right-angle side with a sub-pixel in the object pixel.

6. The pixel structure according to claim 4, wherein the green sub-pixels occupy more than half of a total area of the first pixels, the second pixels and the third pixels.

7. A pixel structure, comprising:
   a plurality of first pixels, second pixels and third pixels;
   wherein each of the first pixels comprises a first type of sub-pixel arranged at its upper-left part and a second type of sub-pixel arranged at its lower-right part;
   wherein each of the second pixels comprises a third type of sub-pixel arranged at its upper-left part and the first type of sub-pixel arranged at its lower-right part;
   wherein each of the third pixels comprises the second type of sub-pixel arranged at its upper-left part and the third type of sub-pixel arranged at its lower-right part; and
   wherein the second pixels are arranged at the right and lower sides of the first pixels, the third pixels are arranged at the right and lower sides of the second pixels, and the first pixels are arranged at the right and lower sides of the third pixels.

8. The pixel structure according to claim 7, wherein the first type of sub-pixel, the second type of sub-pixel and the third type of sub-pixel are in the shape of a right triangle;
   wherein in said each of the first pixels, a hypotenuse of the first type of sub-pixel corresponds to that of the second type of sub-pixel;
   wherein in said each of the second pixels, a hypotenuse of the third type of sub-pixel corresponds to that of the first type of sub-pixel; and
   wherein in said each of the third pixels, a hypotenuse of the second type of sub-pixel corresponds to that of the third type of sub-pixel.

9. The pixel structure according to claim 8, wherein the right triangle is an isosceles right triangle.

10. The pixel structure according to claim 7, wherein the first type of sub-pixel, the second type of sub-pixel and the third type of sub-pixel are different, and correspond to a red sub-pixel, a green sub-pixel and a blue sub-pixel, respectively.

11. The pixel structure according to claim 8, wherein an adjacent sub-pixel of an object pixel is a sub-pixel that shares a right-angle side with a sub-pixel in the object pixel.

12. The pixel structure according to claim 10, wherein the green sub-pixels occupy more than half of a total area of the first pixels, the second pixels and the third pixels.

13. A display substrate, comprising the pixel structure according to claim 1.

14. A display device, comprising the display substrate according to claim 13.

15. The pixel structure according to claim 4, wherein an adjacent sub-pixel of an object pixel is a sub-pixel that shares a right-angle side with a sub-pixel in the object pixel.

16. The pixel structure according to claim 2, wherein the first type of sub-pixel, the second type of sub-pixel and the third type of sub-pixel are different, and correspond to a red sub-pixel, a green sub-pixel and a blue sub-pixel, respectively.

17. The pixel structure according to claim 16, wherein an adjacent sub-pixel of an object pixel is a sub-pixel that shares a right-angle side with a sub-pixel in the object pixel.

18. The pixel structure according to claim 8, wherein the first type of sub-pixel, the second type of sub-pixel and the third type of sub-pixel are different, and correspond to a red sub-pixel, a green sub-pixel and a blue sub-pixel, respectively.

19. A display substrate, comprising the pixel structure according to claim 7.

20. A display device, comprising the display substrate according to claim 19.

* * * * *